United States Patent [19]

Allen

[11] Patent Number: 4,511,809

[45] Date of Patent: Apr. 16, 1985

[54] SWITCH CIRCUIT HAVING IMPROVED SWITCHING CHARACTERISTICS

[75] Inventor: Gordon H. Allen, Mesa, Ariz.

[73] Assignee: Motorola, Inc., Schaumburg, Ill.

[21] Appl. No.: 461,327

[22] Filed: Jan. 27, 1983

[51] Int. Cl.³ .................. H03K 17/60; H03K 3/01
[52] U.S. Cl. .................. 307/254; 307/255; 307/270; 307/300
[58] Field of Search .......... 307/254, 255, 270, 300; 318/345 B; 330/292

[56] References Cited

U.S. PATENT DOCUMENTS

| | | | |
|---|---|---|---|
| 3,233,161 | 2/1966 | Sikorra | 318/345 B |
| 3,525,883 | 8/1970 | Iordanidis | 307/254 |
| 3,538,353 | 11/1970 | Hanger | 307/255 |
| 3,828,206 | 8/1974 | Zuk | 307/254 |
| 4,234,805 | 11/1980 | Carlsen, II | 307/254 |

Primary Examiner—Stanley D. Miller
Assistant Examiner—B. P. Davis
Attorney, Agent, or Firm—Michael D. Bingham

[57] ABSTRACT

A "H" switching circuit for providing current drive to a load coupled between first and second outputs thereof comprising first and second paired switching transistor circuits each including an upper transistor that is cross-coupled at the first and second outputs to a respective paired lower transistor. The respective pairs of switching transistors are alternately rendered conductive whereby the polarity of the load current drive may be reversed. First and second transistors are provided with each being coupled respectively between a lower transistor of one of the paired switching transistor circuits and the upper transistors of the other one of the paired switching transistor circuits for severely limiting current spikes that otherwise occur during switching at the outputs of the switching circuit.

2 Claims, 1 Drawing Figure

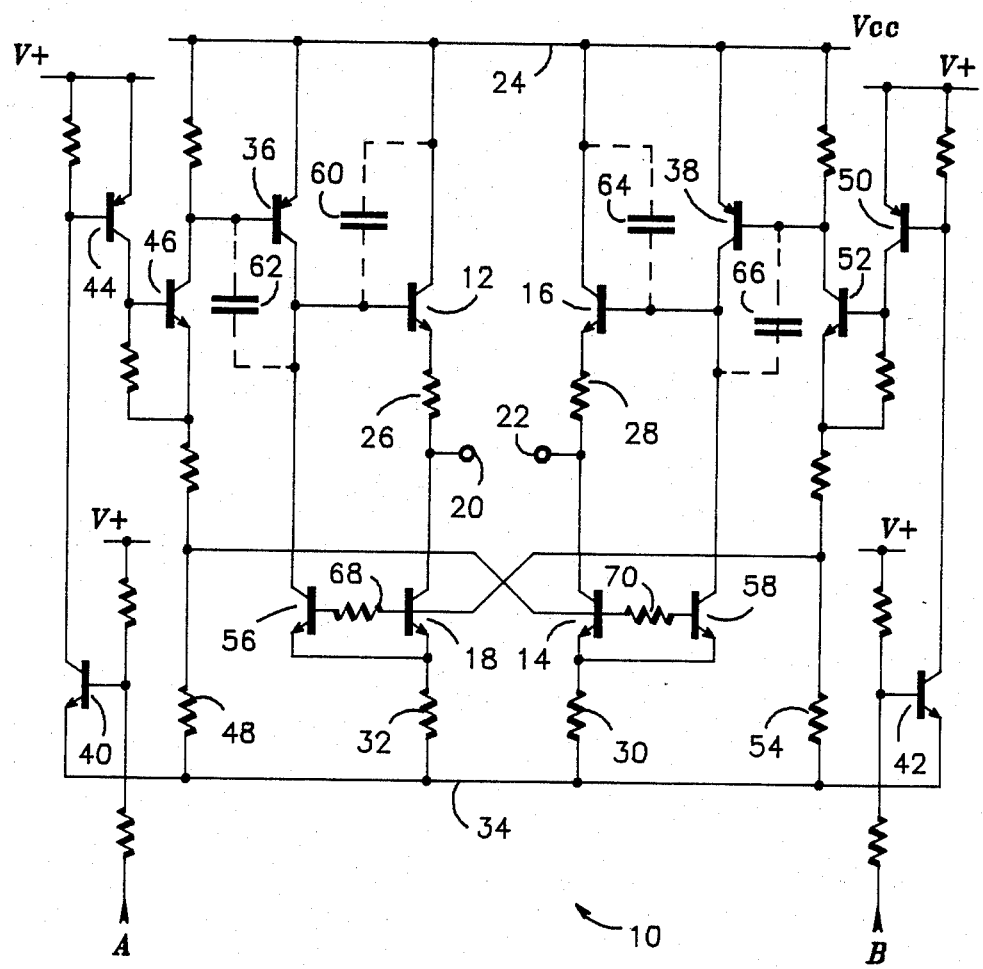

SWITCH CIRCUIT HAVING IMPROVED SWITCHING CHARACTERISTICS

BACKGROUND OF THE INVENTION

The present invention relates to switching circuits and more particularly, to a "H" switching circuit that is suitable to be used to drive a step motor or the like.

In its basic form, the "H" switching circuit generally is comprised of a pair of upper switching transistors and a pair of lower switching transistors. Each upper switching transistor is coupled to a respective output between which a load is to be connected such that the upper switching transistor is cross coupled therethrough to the opposite lower switching transistor thereby forming first and second paired switching transistor circuits.

In operation the first and second paired switching transistor circuits may be alternately rendered conductive to alternately reverse the polarity of current drive flowing through the load. The structure and operation of the aforedescribed "H" switch circuit is generally understood by those skilled in the art.

A problem can arise in the above described "H" switching circuit due to the parasitic collector-base capacitances of the two upper switching transistors in conjunction with the parasitic capacitances of any driving transistors that may be connected therewith. For example, current spikes can be generated at the base of the respective upper switching transistor that is being turned off in response to the other paired switching transistor circuit being turned on. This parasitic current spike is amplified by the particular upper transistor and is passed directly to the lower transistor of the other one of the paired switching transistor circuits which is directly connected therewith. Not only is the amount of load current undesirably reduced by this parasitic capacitance produced large current spike, but there also arises undesirable die heating, circuit metal migration and attendant reliability problems.

Therefore, a need exists for a "H" switching circuit having improved switching characteristics in which parasitic capacitance produced current spikes are severely limited.

SUMMARY OF THE INVENTION

Accordingly, it is an object of the present invention to provide an improved "H" switching circuit having improved switching characteristics.

A still further object of the present invention is to provide a monolithic integrated switching circuit having improved switching characteristics.

An additional object of the present invention is to provide a monolithic integrated "H" switching circuit having improved switching characteristics.

In accordance with the above and other objects there is provided a switch circuit having a pair of outputs between which a load can be connected, comprising first and second paired switching transistor circuits, each of which include an upper transistor coupled to a respective one of the outputs and a lower transistor coupled respectively to the opposite one of the pair of outputs to which its paired upper transistor is coupled; switching circuit means responsive to switching signals applied thereto for alternately rendering said first and second paired switching transistor circuits conductive for producing current through the load having a corresponding polarity associated therewith; a first transistor coupled between the upper transistor of said first paired switching transistor circuit and said lower transistor of said second paired switching transistor circuit which is rendered conductive by said switching circuit means for passing any parasitic currents that appear at the input of said upper transistor to ground reference potential; and a second transistor coupled between the upper transistor of said second paired switching transistor circuit and said lower transistor of said first paired switching transistor circuit which is rendered conductive by said switching circuit means for passing any parasitic currents that appear at the input of the upper transistor to ground reference potential.

BRIEF DESCRIPTION OF THE DRAWING

The sole FIGURE is a schematic diagram illustrating the switching circuit of the preferred embodiment of the invention.

DETAILED DESCRIPTION OF THE PREFERRED EMBODIMENT

"H" switch circuit 10, which is suited to be fabricated in monolithic integrated circuit form, is shown in the sole FIGURE. Switch circuit 10 includes first and second respective paired switching transistor circuits comprising transistors 12: 14 and 16: 18 which are cross-connected through output terminals 20 and 22. Upper transistors 12 and 16 each have respective collector electrodes coupled to power supply conductor 24 at which is supplied a source of operating potential $V_{CC}$. The emitter of upper transistor 12 is coupled via resistor 26 to output 20. Transistor 12 and transistor 14 form the first paired switching transistor circuit by upper transistor 12 being cross-coupled to the collector electrode of lower switching transistor 14 whenever a load is connected between outputs 20 and 22. Likewise, the emitter of upper transistor 16 is cross-coupled via resistor 28 and output terminal 22 to the collector electrode of lower transistor 18 thereby forming the second paired switching transistor circuit. The emitter electrodes of transistors 14 and 18 are returned through respective resistors 30 and 32 to power supply conductor 34 at which is supplied a reference potential $-V$.

It should be noted that certain resistors are not specifically designated by reference numerals in the FIGURE. These resistors are used in a conventional manner to provide biasing as is understood. Transistors 12 and 16 are driven respectively by driver transistors 36 and 38 which supply base current drive to the former when rendered conductive. The base electrode of driver transistors 36 and 38 are coupled to switching circuit means such that these transistors are alternately rendered conductive in response to switching signals A and B that are supplied to the respective inputs of the switching circuit means. The switching circuit means is illustrated as including transistors 40 and 42 which have their base electrodes coupled to the inputs of the switching circuit means wherein these transistors are rendered conductive in response to the switching signals A and B respectively.

In operation, a load device (not shown) is connected between output terminals 20 and 22. For instance, if "H" switch circuit 10 is to drive a stepping motor, the coil of one phase of the stepping motor would be placed between terminals 20 and 22. Thus, in response to switching signal A, transistor 40 is rendered conductive to thereby render transistors 44 and 46 conductive wherein base current drive is sourced from driver transistor 36 to render transistor 12 conductive. Simultaneously, as transistor 46 is rendered conductive, a bias voltage is developed across resistor 48 which renders lower transistor 14 conductive such that load current is sourced from transistor 12, through the load, to lower transistor 14.

In a similar manner, the load current can be reversed to flow from output terminal 22 to output terminal 20, by simultaneously turning off transistors 12 and 14 and turning on transistors 16 and 18. This change of state occurs when switching signal B is applied to the switching circuit while switching signal A is inhibited thereby rendering transistor 42 conductive. When transistor 42 is rendered conductive transistors 50 and 52 are both turned on to render driver transistor 38 conductive, in turn, render transistor 16 conductive. In addition, a bias voltage is developed across resistor 54 to render lower transistor 18 conductive such that current is sourced from the emitter of transistor 16 through the load and through the collector-emitter path of transistor 18.

The operation of "H" switch circuit 10 described above may be considered conventional in its operation. A problem occurs in the switch circuit due to parasitic current spikes that can otherwise occur during switching of switch circuit 10, absent transistors 56 and 58. For example, a severe power supply current spike is generated whenever transistor 18 turns on thereby pulling output 20 to a low voltage level. This current spike is generated due to the parasitic collector-base capacitors 60 and 62 associated with transistors 12 and 36 respectively. As the voltage at output 20 goes low, a voltage extension is produced across the collector-base junctions of both transistors 12 and 36. This voltage expansion produces parasitic capacitive currents through capacitor 60 and 62 which become positive base drive for transistor 12. Thus, transistor 12, which should normally be turned off in the described circuit operation, responds to the positive base current spike by passing a proportional amount of current from power supply conductor 24 to power supply conductor 34 through transistor 18. The amount of this parasitic current passed to transistor 18 subtracts from the current which would otherwise be applied through the load. Similarly, parasitic capacitors 64 and 66 cause a parasitic current spike to be produced through transistor 16 which is passed to transistor 14, absent transistor 58, whenever output 22 is driven to a low voltage state by transistor 14 being rendered conductive.

The aforedescribed parasitic current spikes are greatly reduced by the addition of transistors 56 and 58 of the preferred embodiment. Thus, when transistor 18 turns on, pulling output terminal 20 to a low voltage level, transistor 56 is rendered conductive to pass the parasitic current to power supply conductor 34 through its collector-emitter path. The current spike established through transistor 56 is much less than the current spike previously described since the parasitic current established through transistor 12, absent transistor 56, is amplified by this transistor which is not the case when transistor 56 is utilized. Similarly, the parasitic current spikes are greatly reduced when the voltage at output 22 goes from a high to a low state due to the inclusion of transistor 58. Resistors 68 and 70 are provided to insure that most of the base drive is supplied to transistors 18 and 14 and is not stolen by the respective transistors 56 and 58.

Hence, what is described above is a "H" switch circuit including parasitic current inhibiting circuit means for improving the switching characteristics of the switch. The circuit means inhibits massive current spikes from otherwise occurring during switching at the outputs of the switch circuit which can otherwise reduce the load current drive available at the outputs. These current spikes can also cause needless die heating and circuit metal migration with attendant reliability problems which are highly undesirable.

I claim:

1. A switch circuit having a pair of outputs between which a load may be connected, comprising;

first and second respective paired switching transistor circuits each of which includes an upper transistor coupled to a respective one of the outputs and a lower transistor coupled respectively to the opposite one of the pair of outputs to which its paired upper transistor is coupled;

switching circuit means responsive to switching signals applied thereto for alternately rendering said first and second paired switching transistor circuits conductive for producing current through the load;

said upper transistor of each of said paired switching transistor circuits having an emitter coupled to a respective one of the pair of outputs, a collector coupled to a first power supply conductor, and a base;

said lower transistor of each of said paired switching transistor circuits having an emitter coupled to a second power supply conductor, a collector coupled to said emitter of the opposite one of said upper transistors respectively, and a base coupled to said switching circuit means;

first and second driver transistors each having a collector coupled to said base of a respective upper transistor, an emitter coupled to said first power supply conductor, and a base coupled to said switching circuit means;

a first transistor having an emitter; collector and base, said emitter being coupled to said emitter of said lower transistor of said second paired switching transistor circuit, said collector being connected to said base of said upper transistor of said first paired switching transistor circuit, and said base being coupled to said base of said lower transistor of said second paired switching transistor circuit, said first transistor being rendered conductive by said switching circuit means when said lower transistor of said second paired switching transistor circuit is rendered conductive for passing parasitic currents appearing at said base of said upper transistor of said first paired switching transistor circuit to said second power supply conductor, said first transistor otherwise being non-conductive;

a second transistor having an emitter, collector and base, said emitter being coupled to said emitter of said lower transistor of said first paired switching transistor circuit, said collector being connected to said base of said upper transistor of said second paired switching transistor circuit, and said base being coupled to said base of said lower transistor of said first paired switching transistor circuit, said second transistor being rendered conductive by said switching circuit means when said lower transistor of said first paired switching transistor circuit is rendered conductive for passing parasitic currents appearing at said base of said upper transistor of said second paired switching transistor circuit to said second power supply conductor, said second transistor otherwise being non-conductive.

2. A monolithic integrated switch circuit including first and second paired switching transistor circuits each having an upper and lower transistor coupled respectively to opposite ones of a pair of outputs and being responsive to switching signals applied thereto such that the first and second paired switching transistor circuits are alternately rendered conductive to produce load current through a load coupled between the pair of outputs, the improvement comprising circuit means coupled between the upper and lower transistors of each one of the first and second paired switching transistor circuits which is responsive to the switching signals for shunting parasitic current transients that appear at the base electrode of a respective upper transistor to ground potential when the lower transistor of the opposite one of the respective paired switching transistor circuit is rendered conductive wherein said circuit means includes a first transistor having an emitter and base coupled respectively to the emitter and base of the lower transistor of the second paired switching transistor circuit, and a collector connected to the base of the upper transistor of the first paired switching transistor circuit, and a second transistor having an emitter and base coupled respectively to the emitter and base of the lower transistor of the first paired switching transistor circuit and a collector connected to the base of the upper transistor of the second paired switching transistor circuit.

* * * * *